United States Patent
Zhou et al.

(10) Patent No.: US 6,524,963 B1
(45) Date of Patent: Feb. 25, 2003

(54) METHOD TO IMPROVE ETCHING OF ORGANIC-BASED, LOW DIELECTRIC CONSTANT MATERIALS

(75) Inventors: Mei Sheng Zhou, Singapore (SG); Simon Chooi, Singapore (SG); Jian Xun Li, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/421,510

(22) Filed: Oct. 20, 1999

(51) Int. Cl.[7] .............................................. H01L 21/302
(52) U.S. Cl. ........................ 438/714; 438/725; 438/696; 438/700; 134/1.2; 216/67
(58) Field of Search ............................. 134/1.2; 438/725, 438/696, 700, 714; 216/67

(56) References Cited

U.S. PATENT DOCUMENTS

| | | | |
|---|---|---|---|
| 5,232,872 A | | 8/1993 | Ohba ........................ 437/192 |
| 5,661,083 A | * | 8/1997 | Chen et al. ................. 438/637 |
| 5,728,259 A | | 3/1998 | Suzawa et al. ........... 156/646.1 |
| 5,759,906 A | | 6/1998 | Lou ............................. 438/623 |
| 5,888,309 A | | 3/1999 | Yu ............................... 134/1.2 |
| 5,888,905 A | | 3/1999 | Taylor et al. ............... 438/705 |
| 6,030,901 A | * | 2/2000 | Hoppen et al. ............. 438/711 |
| 6,054,398 A | * | 4/2000 | Pramanick ................. 438/784 |
| 6,087,724 A | * | 7/2000 | Shield et al. ............... 257/734 |
| 6,114,250 A | * | 9/2000 | Ellingboe et al. .......... 438/709 |
| 6,124,213 A | * | 9/2000 | Usami et al. ............... 438/710 |
| 6,235,453 B1 | * | 5/2001 | You et al. ................... 430/329 |
| 6,331,380 B1 | * | 12/2001 | Ye et al. ..................... 430/318 |

FOREIGN PATENT DOCUMENTS

JP 06-232098 * 8/1994

* cited by examiner

Primary Examiner—George Goudreau
(74) Attorney, Agent, or Firm—George O. Saile; Rosemary L. S. Pike

(57) ABSTRACT

A method etching an organic-based, low dielectric constant material in the manufacture of an integrated circuit device has been achieved. Organic materials without silicon and organic materials without fluorine can be etched by using, for example, hydrazine or ammonia gas. Organic materials with silicon can also be etched with the addition of a fluorine-containing or chlorine-containing gas. A semiconductor substrate is provided. A low dielectric constant organic-based material is deposited overlying the semiconductor substrate. The low dielectric constant organic-based material is etched to form desirable features using a plasma containing a gas comprising a nitrogen and hydrogen containing molecule, and the integrated circuit device is completed.

29 Claims, 3 Drawing Sheets

METHOD TO IMPROVE ETCHING OF ORGANIC-BASED, LOW DIELECTRIC CONSTANT MATERIALS

BACKGROUND OF THE INVENTION (1) Field of the Invention

The invention relates to a method of fabricating semiconductor structures, and more particularly, to the etching of organic-based, low dielectric constant materials in the manufacture of integrated circuit devices.

(2) Description of the Prior Art

With the continuing reduction in the feature size in the art of semiconductor manufacture, conductive traces and active devices are now fabricated very closely together. This greater proximity has led to the tremendous packing densities of modern ultra large-scale integration (ULSI). With these greater densities and closer device spacings has come the problem of greater capacitive coupling between adjacent circuit elements.

Traditionally, circuit elements have been electrically isolated primarily through the use of silicon dioxide. Silicon dioxide is well-known in the art as a fundamental building block in integrated circuit manufacture. It is easy to form through thermal oxidation of silicon or by various deposition methods. Silicon dioxide is also easy to reliably etch through both wet and dry chemistry.

Unfortunately, the dielectric constant of silicon dioxide is relatively high. This is an advantage when silicon dioxide is used, for example, as a gate dielectric. It is a disadvantage, however, when silicon dioxide is used to isolate, for example, adjacent metal conductors. In this application, the relatively high dielectric constant of the silicon dioxide can cause significant capacitive coupling between the metal lines. This problem is especially pronounced in modern ULSI circuits, where metal lines are formed with very small spaces between them. Often, these lines run relatively long distances in parallel (as data or address buses, for example). The capacitive coupling can cause problems with high-speed operation and with data errors due to cross talk between the conductors.

To reduce the capacitive coupling between elements in the circuit, while still achieving the essential electrical isolation, new dielectric materials have been developed and introduced into integrated circuit manufacturing. These new materials typically are based on organic compounds that may also contain inorganic elements, such as silicon. For example, spin-on-glass (SOG) materials, such as silsesquioxane have been introduced. Amorphous carbon dielectric materials and organic polymers have also been applied in place of silicon dioxide. These new materials reduce the dielectric constant of the insulating layer formed, thus improving circuit performance.

There are many difficulties to overcome in using these new materials, however. One problem of particular concern is etching. Traditional methods and chemistries used for etching these new materials encounter problems as will be seen in the prior art example.

Referring to FIG. 1, a cross-section of a partially completed prior art integrated circuit device is shown. In this example, a damascene via is being formed. A semiconductor substrate 10 is shown. The semiconductor substrate 10 could be composed of silicon or of several microelectronics layers such as insulator layers and conductor layers. Metal traces 18 are formed in a first insulating layer 14 overlying the semiconductor substrate 10. A second insulating layer 22, typically of silicon nitride, overlies and isolates the metal traces 18. A low dielectric constant material 26 comprised of an organic-based material is applied overlying the second insulating layer 22. Finally, a polishing stop layer 30, typically comprised of silicon nitride, overlies the low dielectric constant material 26. In this example, the trench to create a damascene via to contact the metal traces 18 will be constructed.

Referring now to FIG. 2, a photoresist layer 32 overlies the polishing stop layer 30. The photoresist layer 32 is patterned to form openings where trench vias are planned. The polishing stop layer 30 is so named because it will stop the polishing operation used to define the subsequently deposited metal material to the confines of the damascene trench. Here, the polishing stop layer 30 will also act as a hard mask for etching the low dielectric constant material 26.

Referring now to FIG. 3, the polishing stop layer 30 and the low dielectric constant material 26 are etched. The polishing stop layer is etched using fluorocarbon chemistry. Typically, the etching of the organic low dielectric constant material 26 is performed using an oxygen plasma chemistry. The typical reaction for such an etch is given by:

$$C_xH_yN_z + O_2 \rightarrow CO_2 + H_2O + NO_x.$$

Oxygen etching has the advantage of generating and depositing little polymer onto the sidewalls of the etched feature. Unfortunately, the etching profile is difficult to control and over etching 34, sometimes called bowing, is often seen. These results can lead to loss of device yield, as well as reliability problems, through the creation of voids and device shorts.

A second technique used to etch the low dielectric constant material 26 uses a plasma containing hydrogen gas and nitrogen gas. The use of hydrogen to reduce, rather than to oxidize the material, improves the etching control. The profiles produced by this type of etch chemistry are better than those produced using an oxygen chemistry. The hydrogen reaction is typically shown as:

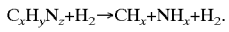

$$C_xH_yN_z + H_2 \rightarrow CH_x + NH_x + H_2.$$

The main problem with the hydrogen and nitrogen chemistry is one of safety. Hydrogen is highly flammable. Any inadvertent introduction of oxygen into the etching chamber can lead to an explosion. In addition, because both hydrogen and nitrogen gas are separately ported to the reaction chamber, separate utilities, including mass flow controllers (MFC) must be used.

Several prior art approaches disclose methods to etch low dielectric constant materials as well as uses of hydrazine compounds in the fabrication of integrated circuits. U.S. Pat. No. 5,232,872 to Ohba teaches a process to form conductive connections on a semiconductor substrate by using $N_2H_4$ (hydrazine) and related compounds to clean contact openings and to catalyze deposition of metals from metal complexes. U.S. Pat. No. 5,728,259 to Suzawsa et al discloses a process to etch silicon thin films using liquid hydrazine. U.S. Pat. No. 5,888,309 to Yu teaches a method to etch various low dielectric constant materials where first a fluorine containing plasma is used to etch an opening. Next, an oxygen plasma is used to remove the photoresist patterned layer and to partially etch the polymer formed in the opening by the fluorine etch. Finally, the polymer is removed by a wet chemical strip. U.S. Pat. No. 5,759,906 to Lou shows a planarization process for low dielectric constant materials.

U.S. Pat. No. 5,888,905 to Taylor et al discloses a polymer formation and etchback method to form a low dielectric constant material on an integrated circuit.

SUMMARY OF THE INVENTION

A principal object of the present invention is to provide an effective and very manufacturable method of etching organic-based, low dielectric constant materials in the manufacture of integrated circuits.

A further object of the present invention is to provide a method to etch organic-based, low dielectric constant materials that improves the etching control and profile by using a plasma containing a gas comprising a nitrogen and hydrogen containing molecule.

A yet further object of the present invention is to provide a method to etch organic-based, low dielectric constant materials that eliminates potential safety problems associated with the use of hydrogen gas by using a plasma containing a gas comprising a nitrogen and hydrogen containing molecule.

Another yet another further object of the present invention is to provide a method to etch organic-based, low dielectric constant materials that requires only one etching gas by using a plasma containing a gas comprising a nitrogen and hydrogen containing molecule.

Another yet further object of the present invention is to provide a method to etch organic-based low dielectric constant materials that also contain fluorine by using a plasma containing a gas comprising a nitrogen and hydrogen containing molecule.

Another further object of the present invention is to provide a method to etch organic-based, low dielectric constant materials that also contain silicon by adding a fluorine-containing gas or a chlorine-containing gas to the plasma containing a gas comprising a nitrogen and hydrogen containing molecule.

In accordance with the objects of this invention, a new method of etching an organic-based, low dielectric constant materials in the manufacture of an integrated circuit device has been achieved. A semiconductor substrate is provided. A low dielectric constant organic-based material is deposited overlying the semiconductor substrate. The low dielectric constant organic-based material is etched to form desirable features using a plasma containing a gas comprising a nitrogen and hydrogen containing molecule, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

This embodiment discloses the application of the present invention to etching low dielectric constant organic-based materials in the fabrication of an integrated circuit device. A low dielectric constant material is defined as one having a dielectric constant of less than 3.5. A number of such materials are listed in the preferred embodiment of the present invention. It should be clear to those experienced in the art that the present invention can be applied and extended, for example, to new, but similar, compounds that are developed or applied to semiconductor manufacture. In addition, the preferred embodiment describes the application of the present invention to the formation of a single damascene via. It should be clear to those skilled in the art that the present invention can easily be applied to various damascene schemes, such as dual damascene. In dual damascene schemes, the interconnect will typically comprise a passivation layer, a first dielectric layer, an etching stop layer, a second dielectric layer, and a cap layer (or polishing stop layer). The present invention could be applied to many applications where etching of low dielectric constant organic-based materials is necessary.

Figure 1:
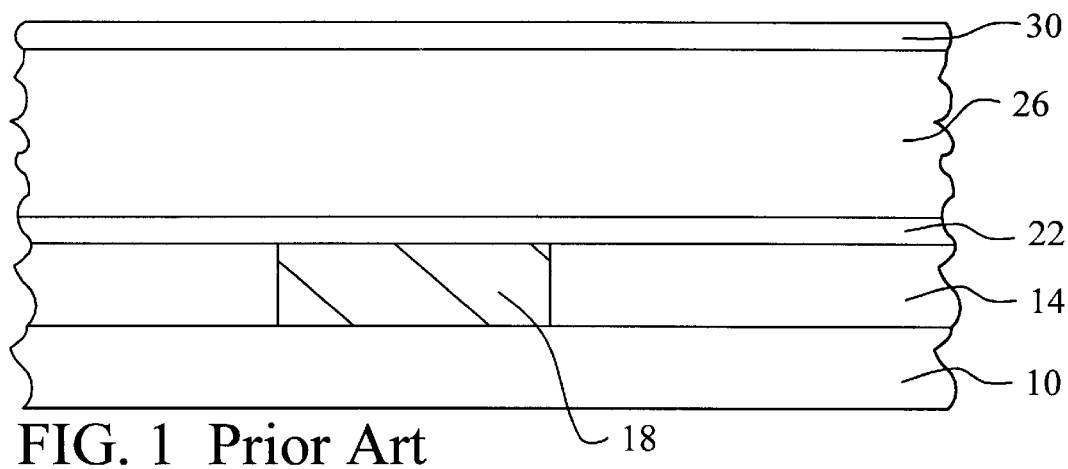
FIGS. 1 through 3 schematically illustrate in cross-section a partially completed prior art integrated circuit device.
Figure 2:
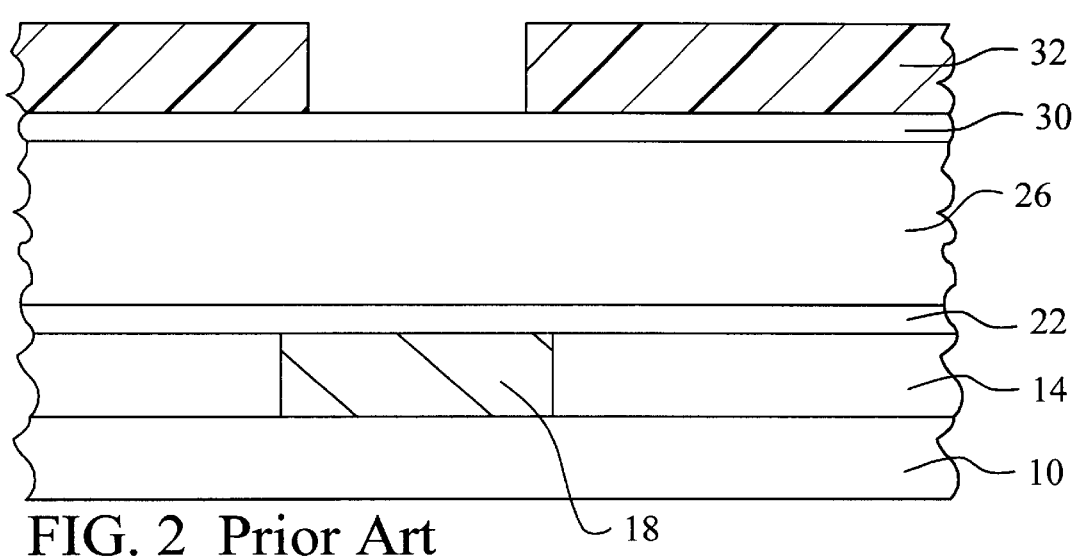
Figure 3:
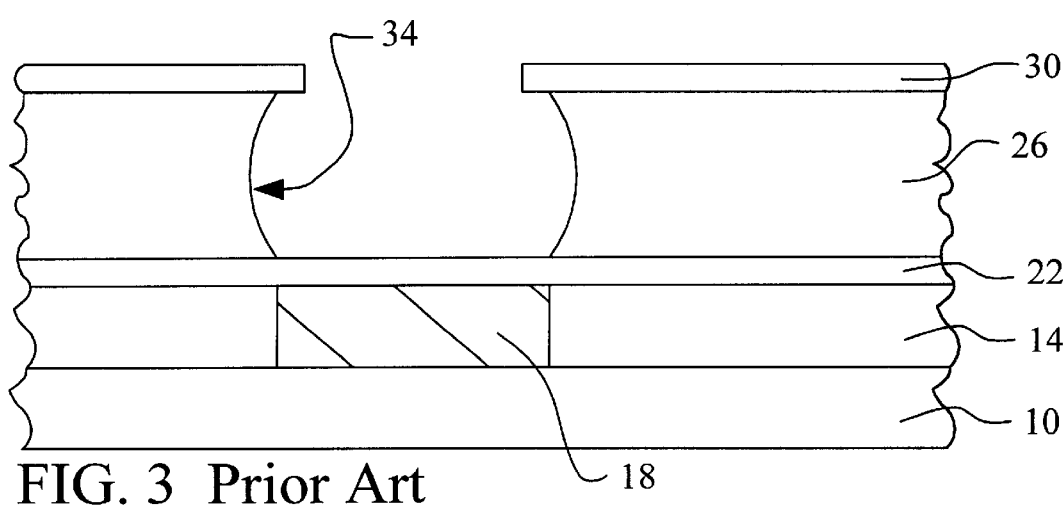
Figure 4:
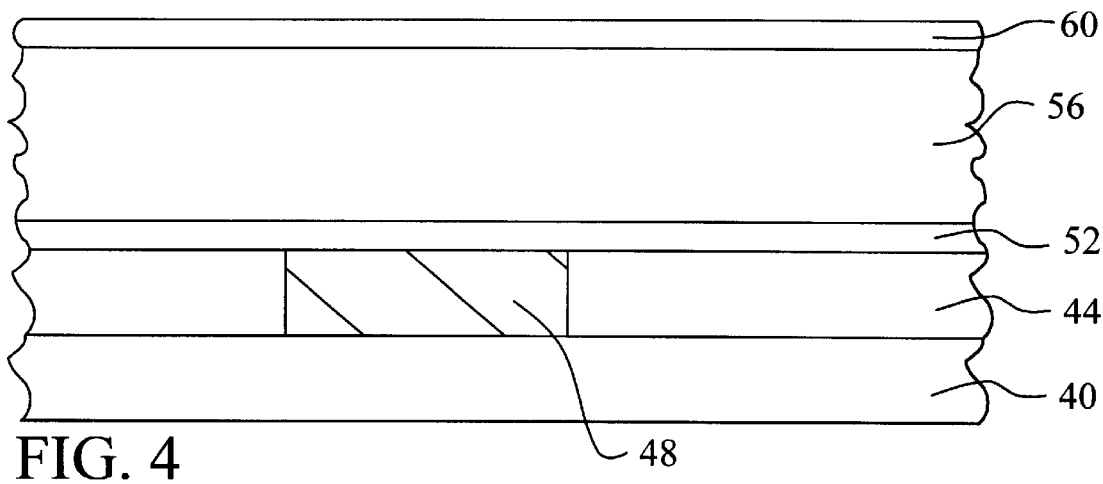
FIGS. 4 through 8 schematically illustrate in cross-sectional representation a preferred embodiment of the present invention.

Referring now particularly to FIG. 4, there is shown a cross section of a partially completed integrated circuit device of the preferred embodiment. A damascene via will be used to demonstrate the present invention. A semiconductor substrate 40 is provided. Although not specifically illustrated within the schematic cross section of FIG. 4, such a semiconductor substrate 40 may comprise a substrate alone as employed within a microelectronic fabrication. Alternatively, the semiconductor substrate 40 may comprise that employed within a microelectronic fabrication wherein the substrate has formed thereupon and/or thereover, and thus incorporated therein, any of the several additional microelectronics layers (for example, damascene or aluminum alloy metal interconnects) as are commonly employed within the microelectronics fabrication within which is employed the substrate.

Metal traces 48 are formed in a first insulating layer 44 overlying the semiconductor substrate 40. The metal traces 48 are formed as conventional in the art. For example, if a damascene technique were used, the first insulating layer 44 would first be deposited overlying the semiconductor substrate 40. Trenches would be etched into the first insulating layer 44 in the desired pattern of the planned traces. The barrier metal, which is not shown, and the metal layer 48 would then be deposited overlying the first insulating layer 44 and filling the trenches as conventional in the art. Finally, the excess metal layer 48 would be removed, for example, by chemical mechanical polishing. The first insulating layer 44 could well be a low dielectric constant material, though that is not necessary in this embodiment.

A second insulating layer 52, or passivation layer, is deposited overlying the first insulating layer 44 and the metal traces 48. In the preferred embodiment, the second insulating layer 52 comprises silicon nitride that is deposited typically by a chemical vapor deposition (CVD) process. Since the focus of the present invention is etching the low dielectric constant layer, the exact composition of the second insulating layer 52 is not important.

The low dielectric constant layer 56 is deposited overlying the second insulating layer 52. The low dielectric constant layer 56 comprises an organic-based film. Several main types include amorphous carbon dielectric materials, organic polymers, and organic compounds that contain inorganic elements, such as silicon and fluorine. The low dielectric constant layer 56 must be a type of material that can be etched using a plasma containing a gas comprising a nitrogen and hydrogen containing molecule. If the low dielectric constant layer 56 contains silicon, as in the case of silsesquioxane, for example, then a fluorine-containing or chlorine-containing gas will be added to the plasma. Typically, the low dielectric constant layer 56 will be deposited by a spin-on method or by chemical vapor deposition (CVD). The low dielectric constant layer 56 is preferably deposited to a thickness of between about 1,000 Angstroms and 10,000 Angstroms.

In the preferred embodiment, the low dielectric constant layer 56 comprises one of the group containing: poly (arylethers)—such as Flare™ (manufacture by Allied Signal), VELOX™ (manufactured by Schumacher Air Products), and poly(arlene) ether or SILK™ (manufactured by Dow Chemical); buckministerfullerenes; polyimides; benzocyclobutenes—such as BCB™ (manufactured by Dow Chemical); alkylsilsesquioxanes; amorphous fluorocarbons; fluorinated polyimides; tetrafluoroethylene; polytetrafluoroethylene (PTFE); fluorinated poly(arylethers); and porous organic polymers—including poly(arylethers), polyimides, fluorinated polyimides, benzocyclbbutanes, and alkylsilsesquioxanes.

A polishing stop layer 60 (or cap layer) is deposited overlying the low dielectric constant layer 56. The polishing stop layer 60 is so named because it will stop the polishing operation used to define the subsequently deposited metal material to the confines of the damascene trench. The polishing stop layer 60 is preferably comprised of silicon nitride deposited by CVD.

Figure 5:
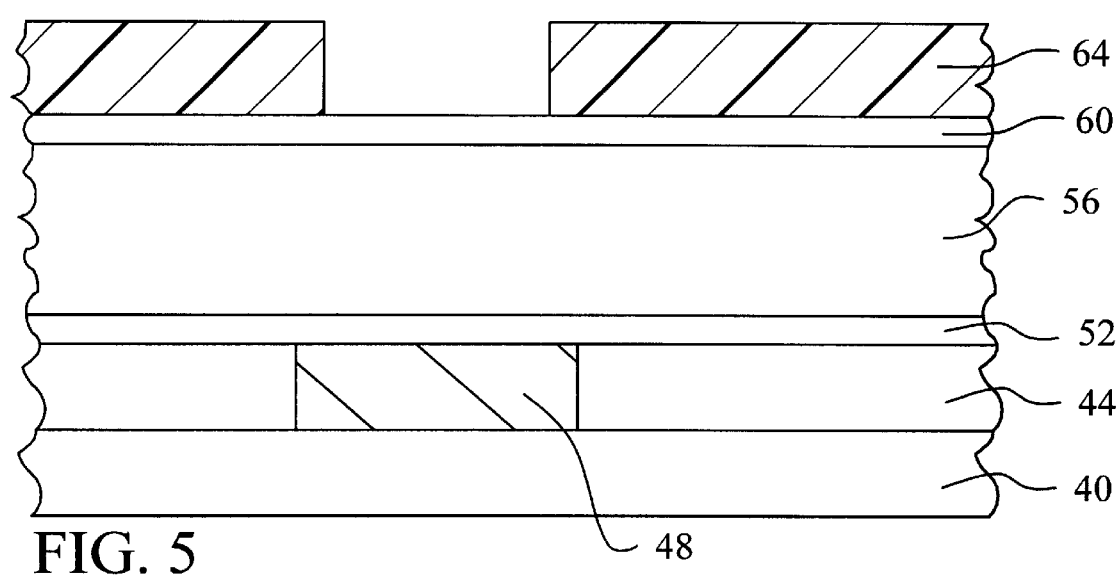

Referring now to FIG. 5, a photoresist layer 64 is applied overlying the polishing stop layer 60. The photoresist layer 64 is patterned to form openings where trenches are planned for the single damascene interconnects.

Figure 6:
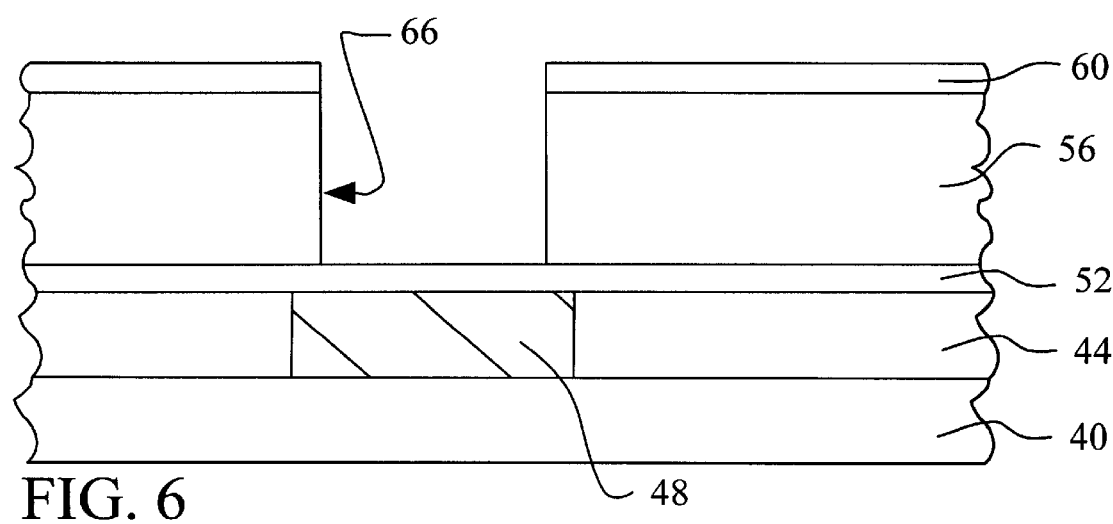

Referring now to FIG. 6, an important aspect of the present invention is described. The polishing stop layer 60 is etched using a plasma dry etch with a fluorocarbon chemistry. The etching chemistry typically comprises one or more gases from the group containing: $CHF_3$, $CF_4$, $C_4F_8$, and $C_2F_6$. Using the polishing stop layer 60 as a hard mask, the low dielectric constant layer 56 is then etched using the novel chemistry of the present invention. A plasma containing a gas comprising a nitrogen and hydrogen containing molecule is used to etch the low dielectric constant layer 56. Two examples of this type of gas molecule are hydrazine ($N_2H_4$) and ammonia ($NH_3$). Other gases can be added as a carrier gas in combination with the nitrogen and hydrogen containing molecule gas. For example, nitrogen, argon, helium, or xenon may be added as carrier gases. In addition, an optional passivation gas, such as methane ($CH_4$), can be added to provide a passivation during the etching of the via.

The plasma is generated in a typical fashion in a reaction chamber at a temperature of between about 0 degrees C. and 300 degrees C., a wafer temperature of between about −30 degrees C. and 300 degrees C., and a pressure of between about 1 milliTorr and 1 Torr. The etching gas chemistry is optimized to completely etch away the photoresist layer 64, whereupon the polishing stop layer 60 would then function as a hard mask during the etching. In the event that the photoresist layer 64 is not completely removed after the etching, an oxygen plasma or, preferably, a forming gas plasma can be used to strip the remaining photoresist.

Using hydrazine or ammonia provides the advantage of the previously mentioned plasma that combined nitrogen gas and hydrogen gas. Etching of the organic-based, low dielectric constant layer 56 is much better controlled when compared to the prior art, oxygen etch. Lateral overetching and bowing 66 is eliminated. In addition, since the hydrogen is bonded to the nitrogen until the hydrogen ions are released into the plasma, the risk of explosive reactions with oxygen is eliminated. Finally, since only one gas is needed, instead of two, the utility and mass flow control capabilities of the etching process are reduced. This reduces the process cost.

If the low dielectric constant layer 56 also contains silicon, as in the compound silsesquioxane, then a gas comprising molecules containing fluorine or chlorine atoms must be added to the hydrazine or ammonia gas to improve the etching rate of the silicon containing compound. As before, the etching of the low dielectric constant layer 56 is better controlled when compared to oxygen etching. The process is also safer, though it does require the utilities and mass flow controls sufficient for two etching gases. Some gases that could be used include $CF_4$, $C_2F_6$, $Cl_2$, $CHCl_3$, $CHF_3$, $SF_6$, and $C_4F_8$.

Figure 7:
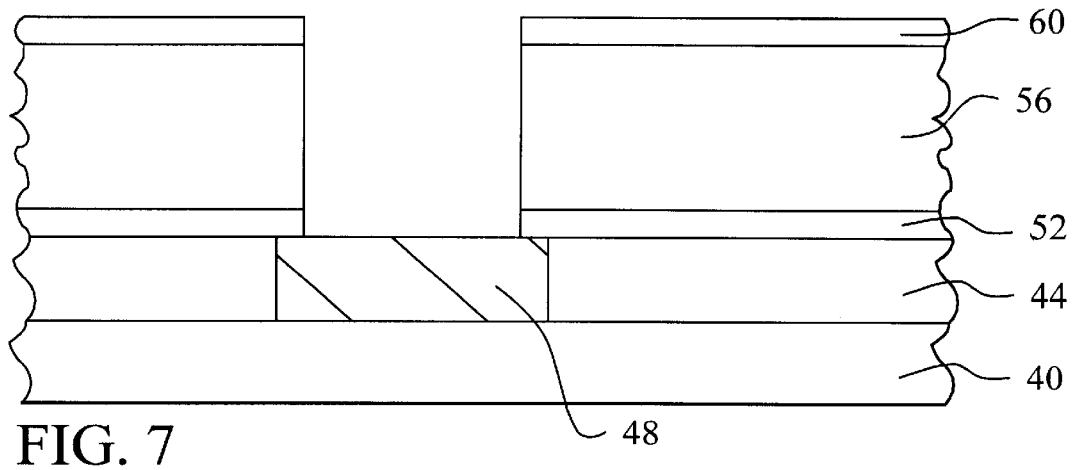

Referring now to FIG. 7, the second insulating layer 52 is etched through to the top surface of the metal traces 48 to complete the via opening. Because the second insulating layer 52 comprises silicon nitride in this exemplary embodiment, it is not etched through by the novel etch chemistry used for etching the low dielectric constant layer 56. The second insulating layer 52 could be etched, for example, using a reactive ion etch (RIE) or high density plasma etch chemistry comprising gases such as: $CF_4$, CHF3, $CH_2F_2$, $CH_3F$, $O_2$, He, Ar, $N_2$, and $NH_3$.

Figure 8:
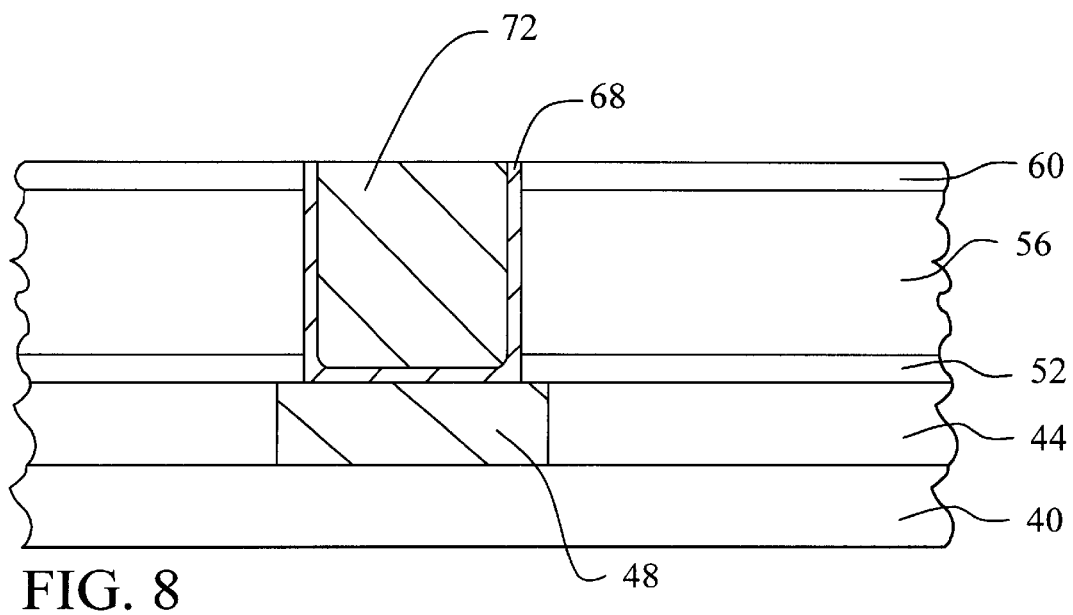

Referring now to FIG. 8, the damascene via structure is completed as typical in the art. A barrier layer 68 of, for example, a refractory metal, is deposited overlying the polishing stop layer 60 and filling the damascene via trench. A metal layer 72, typically copper, is deposited overlying the barrier layer 68. The metal layer 72 and the barrier layer 68 are then polished down to remove the excess metal material and to confine the metal layer 72 and the barrier layer 68 to the damascene via trench as shown. The polishing stop layer 60 stops the polishing operation from contacting the low dielectric constant material 56. The integrated circuit is then finished as typical in the art.

As shown in the preferred embodiment, the present invention provides a very manufacturable process for etching organic, low dielectric constant materials by using a plasma comprising a gas containing nitrogen and hydrogen atoms and a carrier gas in the manufacture of integrated circuit devices. This novel method improves the etching control and eliminates the risk associated with the use of hydrogen gas in the manufacturing environment. Through the addition of fluorine or chlorine containing gases, low dielectric constant organic compounds that also contain silicon can be effectively and safely etched.

While the invention has been particularly shown and described with reference to the preferred embodiments thereof, it will be understood by those skilled in the art that various changes in form and details may be made without departing from the spirit and scope of the invention.

What is claimed is:

1. A method to etch an organic-based, low dielectric constant material in the manufacture of an integrated circuit device comprising:

providing a semiconductor substrate;

depositing a low dielectric constant material overlying said semiconductor substrate wherein said low dielectric constant material comprises primarily organic materials;

etching said low dielectric constant material to form desirable features in the manufacture of said integrated circuit device wherein said etching is by a plasma comprising hydrazine gas and a carrier gas.

2. The method according to claim 1 wherein said low dielectric constant material is selected from the group consisting of: poly(arylethers), buckministerfullerenes, polyimides, benzocyclobutenes, alkylsilsesquioxanes, amorphous fluorocarbons, fluorinated polyimides, tetrafluoroethylene, polytetrafluoroethylene, fluorinated poly(arylethers), porous organic polyimides, porous organic fluorinated polyimides, porous organic benzocyclobutanes, and porous organic alkylsilsesquioxanes.

3. The method according to claim 1 wherein said desirable features are selected from the group consisting of: trenches for single damascene structures, trenches for dual damascene structures, vias for single damascene structures, vias for dual damascene structures, contact openings, and via-openings.

4. The method according to claim 1 wherein said low dielectric constant material does not contain silicon.

5. The method according to claim 1 further comprising adding a passivation gas to said step of etching said low dielectric constant material.

6. The method according to claim 1 wherein said carrier gas is selected from the group consisting of: nitrogen, argon, helium, and xenon.

7. The method according to claim 5 wherein said passivation gas comprises methane.

8. The method according to claim 1 wherein said low dielectric constant material contains silicon.

9. The method according to claim 1 further comprising adding a gas to the plasma wherein said gas is selected from the group consisting of: fluorine-containing molecules and chlorine-containing molecules.

10. The method according to claim 1 wherein said step of etching said low dielectric constant material comprises a plasma generated in a reaction chamber at a temperature of between about 0 degrees C. and 300 degrees C., a wafer temperature of between about −30 degrees C. and 300 degrees C., and a pressure of between about 1 milliTorr and 1 Torr.

11. A method to etch an organic-based, low dielectric constant material in the manufacture of an integrated circuit device comprising:

providing a semiconductor substrate;

depositing a low dielectric constant material overlying said semiconductor substrate wherein said low dielectric constant material comprises primarily organic materials;

etching said low dielectric constant material to form desirable features in the manufacture of said integrated circuit device wherein said etching is by a plasma comprising hydrazine gas, a carrier gas, and a gas selected from the group consisting of: fluorine-containing and chlorine-containing molecules.

12. The method according to claim 11 wherein said low dielectric constant material is selected from the group consisting of: poly(arylethers), buckministerfullerenes, polyimides, porous organic poly(arylethers), porous organic polyimides, porous organic fluorinated polyimides, porous organic benzocyclobutanes, and porous organic alkylsilsesquioxanes.

13. The method according to claim 11 wherein said desirable features are selected from the group consisting of: trenches for single damascene structures, trenches for dual damascene structures, vias for single damascene structures, vias for dual damascene structures, contact openings, and via openings.

14. The method according to claim 11, further comprising adding a passivation gas to said step of etching said low dielectric constant material.

15. The method according to claim 11 wherein said carrier gas is selected from the group consisting of: nitrogen, argon, helium, and xenon.

16. The method according to claim 14 wherein said passivation gas comprises methane.

17. The method according to claim 11 wherein said step of etching said low dielectric constant material comprises a plasma generated in a reaction chamber at a temperature of between about 0 degrees C. and 300 degrees C., a wafer temperature of between about −30 degrees C. and 300 degrees C., and a pressure of between about 1 milliTorr and 1 Torr.

18. A method to etch an organic-based, low dielectric constant material in the manufacture of an integrated circuit device comprising:

providing a semiconductor substrate;

depositing a low dielectric constant material overlying said semiconductor substrate wherein said low dielectric constant material comprises primarily organic materials;

etching said low dielectric constant material to form desirable features in the manufacture of said integrated circuit device wherein said etching is by a plasma comprising a gas comprising a nitrogen and hydrogen containing molecule, a carrier gas, a passivation gas, and a gas selected from the group consisting of: fluorine-containing molecules and chlorine-containing molecules.

19. The method according to claim 18 wherein said low dielectric constant material is selected from the group consisting of: benzocyclobutenes, alkylsilsesquioxanes, porous organic benzocyclobutanes, and porous organic alkylsilsesquioxanes.

20. The method according to claim 18 wherein said desirable features are selected from the group consisting of: trenches for single damascene structures, trenches for dual damascene structures, vias for single damascene structures, vias for dual damascene structures, contact openings, and via openings.

21. The method according to claim 18 wherein said gas containing a nitrogen and hydrogen containing molecule comprises hydrazine.

22. The method according to claim 18 wherein said gas containing a nitrogen and hydrogen containing molecule comprises ammonia.

23. The method according to claim 18 wherein said carrier gas is selected from the group consisting of: nitrogen, argon, helium, and xenon.

24. The method according to claim 18 wherein said passivation gas comprises methane.

25. A method to etch an organic-based, low dielectric constant material in the manufacture of an integrated circuit device comprising:

providing a semiconductor substrate;

depositing a low dielectric constant material overlying said semiconductor substrate wherein said low dielectric constant material comprises primarily organic materials and wherein said low dielectric constant material contains fluorine; and etching said low dielectric constant material to form desirable features in the manufacture of said integrated circuit device wherein said etching is by a plasma comprising hydrazine gas, a carrier gas, and a passivation gas.

26. The method according to claim 25 wherein said low dielectric constant material is selected from the group consisting of: amorphous fluorocarbons, fluorinated polyimides, tetrafluoroethylene, polytetrafluoroethylene, fluorinated poly(arylethers), and porous PTFE.

27. The method according to claim 25 wherein said desirable features are selected from the group consisting of: trenches for single damascene structures, trenches for dual damascene structures, vias for single damascene structures, vias for dual damascene structures, contact openings, and via openings.

28. The method according to claim 25 wherein said carrier gas is selected from the group consisting of: nitrogen, argon, helium, and xenon.

29. The method according to claim 25 wherein said passivation gas comprises methane.

* * * * *